(12) United States Patent
Dee

(10) Patent No.: US 6,765,770 B2
(45) Date of Patent: Jul. 20, 2004

(54) APPARATUS AND METHOD OF MAKING A STABILIZED MR/GMR SPIN VALVE READ ELEMENT USING LONGITUDINAL FERROMAGNETIC EXCHANGE INTERACTIONS

(75) Inventor: Richard Henry Dee, Boulder, CO (US)

(73) Assignee: Storage Technology Corporation, Louisville, CO (US)

( * ) Notice: Subject to any disclaimer, the term of this patent is extended or adjusted under 35 U.S.C. 154(b) by 71 days.

(21) Appl. No.: 09/974,037

(22) Filed: Oct. 11, 2001

(65) Prior Publication Data

US 2003/0072110 A1 Apr. 17, 2003

(51) Int. Cl.⁷ ............................. G11B 5/127; G11B 5/39
(52) U.S. Cl. ................................... 360/324.12
(58) Field of Search ............... 360/324.12, 324.1, 360/324, 317, 313, 110, 327.3, 327.32

(56) References Cited

U.S. PATENT DOCUMENTS

| | | | | |
|---|---|---|---|---|
| 6,266,218 B1 | * | 7/2001 | Carey et al. | 360/324.12 |
| 6,462,919 B1 | * | 10/2002 | Mack et al. | 360/327.3 |
| 6,473,279 B2 | * | 10/2002 | Smith et al. | 360/324.12 |
| 6,556,392 B1 | * | 4/2003 | Mao et al. | 360/324.12 |
| 2001/0033466 A1 | * | 10/2001 | Ooshima et al. | 360/324.12 |
| 2001/0033467 A1 | * | 10/2001 | Engel et al. | 360/325 |
| 2003/0035253 A1 | * | 2/2003 | Lin et al. | 360/324 |

* cited by examiner

*Primary Examiner*—Julie Anne Watko
(74) *Attorney, Agent, or Firm*—Carstens, Yee & Cahoon, LLP

(57) ABSTRACT

An apparatus and method in which a free layer of a spin valve sensor may be stabilized without using permanent magnets are provided. In one embodiment, the free layer is stabilized by a magnetic field applied to the free layer by a ferromagnetic layer pinned at 0 degrees. In an alternative embodiment, the magnetic field is applied by a synthetic antiferromagnetic layer. By eliminating the necessity of having permanent magnets, the drawbacks of these permanent magnets are also eliminated. The apparatus and method eliminate these drawbacks because, (a) layers used in the apparatus and method do not rely on any retention of magnetization; (b) the effect of an effective applied field is not sensitive to adjacent magnetic structures such as shields; (c) there is no permanent magnetism to be altered or lost in the apparatus and method; and (d) the ferromagnetic exchange interaction effect of the apparatus and method is adjustable.

24 Claims, 4 Drawing Sheets

APPARATUS AND METHOD OF MAKING A STABILIZED MR/GMR SPIN VALVE READ ELEMENT USING LONGITUDINAL FERROMAGNETIC EXCHANGE INTERACTIONS

RELATED APPLICATIONS

The present application is related to commonly assigned and copending U.S. patent application Ser. No. 09/894,479 filed Jun. 29, 2001 entitled "REDUCED SENSITIVITY SPIN VALVE HEAD FOR MAGNETIC TAPE APPLICATIONS," U.S. patent application Ser. No. 09/896, 162 filed Jun. 28, 2001 entitled "APPARATUS AND METHOD OF MAKING A REDUCED SENSITIVITY SPIN VALVE SENSOR APPARATUS IN WHICH A FLUX CARRYING CAPACITY IS INCREASED," U.S. patent application Ser. No. 09/894,378 filed Jun. 29, 2001 entitled "APPARATUS AND METHOD OF MAKING A REDUCED SENSITIVITY SPIN VALVE SENSOR APPARATUS IN WHICH A FLUX INJECTION EFFICIENCY IS REDUCED," and U.S. patent application Ser. No. 09/894, 379 filed Jun. 29, 2001 entitled "APPARATUS AND METHOD OF MAKING A REDUCED SENSITIVITY SPIN VALVE SENSOR APPARATUS IN WHICH A BASIC MAGNETIC SENSITIVITY IS REDUCED".

BACKGROUND OF THE INVENTION

1. Technical Field

The present invention is directed to stabilized Magnetoresistive (MR) and/or Giant Magnetoresistive (GMR) spin valve read elements. More specifically, the present invention is directed to apparatus and methods of making stabilized MR/GMR spin valve read elements using longitudinal ferromagnetic exchange interactions.

2. Description of Related Art

The requirement of high density magnetic storage of data on hard disk drives and magnetic tape drives has been increasing steadily for the past several years. Hard disk drives include magnetic heads for reading and writing data to the hard disk. The magnetic heads include write coils and sensors for reading data from the hard disk.

Development of magnetoresistive (MR) sensors (also referred to as heads) for disk drives in the early 1990's allowed disk drive products to maximize storage capacity with a minimum number of components (heads and disks). Fewer components result in lower storage costs, higher reliability, and lower power requirements for the hard disk drives.

MR sensors are used for the read element of a read/write head on high-density magnetic disk and magnetic tape. MR sensors read magnetically encoded information from the magnetic medium of the disk or tape by detecting magnetic flux stored in the magnetic medium. As storage capacity of disk drives has increased, the storage bit has become smaller and its magnetic field has correspondingly become weaker. MR heads are more sensitive to weaker magnetic fields than are the inductive read coils used in earlier disk drives. Thus, there has been a move away from inductive read coils to MR sensors for use in disk drives.

During operation of the hard disk drive, sense current is passed through the MR element of the sensor causing a voltage drop. The magnitude of the voltage drop is a function of the resistance of the MR element. Resistance of the MR element varies in the presence of a magnetic field. Therefore, as the magnitude of the magnetic field flux passing through the MR element varies, the voltage across the MR element also varies. Differences in the magnitude of the magnetic flux entering the MR sensor can be detected by monitoring the voltage across the MR element.

As discussed above, MR sensors are known to be useful in reading data with a sensitivity exceeding that of inductive or other thin film sensors. However, the development of Giant Magnetoresistive (GMR) sensors (also referred to as GMR heads or Spin Valve sensors) has greatly increased the sensitivity and the ability to read densely packed data. Thus, although the storage density for MR disks is expected to eventually reach 5 gigabits per square inch of surface disk drive (Gbits/sq.in.), the storage density of GMR disks is expected to exceed 100 Gbits/sq.in.

The development of MR sensors and GMR sensors, also known as spin valve sensors, have increased the sensitivity of read heads of disk drives thereby allowing for advances in the recording density in magnetic disk recording technologies. However, MR sensors and GMR sensors suffer from domain instabilities resulting in unstable readback signals or Barkhausen noise. These domain instabilities are cause by magnetic domains that form in the soft magnetic sensing layers of MR and GMR read heads. Irregular movement of these domains induced by the signal field from the magnetic medium cause distortions in the read back voltage waveform developed across the MR/GMR sensor.

In order to solve the problems of domain instabilities, known solutions make use of end attached permanent magnets (PMs) to apply a longitudinal easy axis field to suppress the onset of Barkhausen noise in narrow track elements, i.e. MR/GMR devices whose sensing width is small. In magnetic tape medium MR/GMR read heads, "narrow" is approximately less than 10 micrometers. In magnetic disk medium MR/GMR read heads, "narrow" is approximately less than 2 micrometers. These permanent magnets have a number of problems, however.

First, the permanent magnets often become demagnetized or have their magnetizations altered during read head processing and read head use. For example, magnetic fields, temperature and mechanical vibration or shock can alter the magnetizations of the permanent magnets. This is often due to the fact that the most popular magnet used is Cobalt-Platinum (CoPt) or Cobalt-Platinum/Chromium (CoPtCr) magnets, which have little or no uniaxial anisotropy to help keep their magnetizations pointing in the proper direction.

Second, processing of the permanent magnet contact to the MR/GMR element, i.e. the step where the spin valve is etched into its final shape and the permanent magnets are placed on the ends of the spin valve, can cause electrical resistance problems. That is, at this step, the processing of the device forms an abutted electrical junction as well as a magnetically coupled junction. If this process contaminates this interface, the function of the permanent magnets as a stabilizing field source and as an electrical conductor connection is compromised.

Third, the field from the permanent magnets acts on the whole MR/GMR structure rather than just the sensing (free) layer. This complicates the designs of the MR/GMR sensors because the effects of the permanent magnet fields must be accounted for during the design.

Fourth, permanent magnets only really work in very narrow elements, e.g., less that 4 $\mu$m. This is because the permanent magnet field penetration into the MR/GMR sensor is poor. As a result, use in wider disk head and tape head elements is ineffective and methods, such as periodic structures, have been invoked for elements in the width range of 50 μm to 10 μm wide. This is particularly a problem for servo read elements for tape read heads which tend to be in this width range.

Thus, it would be beneficial to have a MR/GMR spin valve read element that is stabilized to reduce domain instabilities and Barkhausen noise. It would further be beneficial to have an apparatus and method of making stabilized MR/GMR spin valve read elements that avoid the problems noted above in the prior art.

SUMMARY OF THE INVENTION

The present invention provides an apparatus and method in which a free layer of a spin valve sensor may be stabilized without using permanent magnets. In one embodiment of the present invention, the free layer is stabilized by a magnetic field applied to the free layer by a ferromagnetic layer pinned at 0 degrees. In an alternative embodiment, the magnetic field is applied by a synthetic antiferromagnetic layer.

By eliminating the necessity of having permanent magnets, the drawbacks of these permanent magnets are also eliminated. The present invention eliminates these drawbacks because, in the present invention, (a) layers used in the present invention do not rely on any retention of magnetization; (b) the effect of an effective applied field is not sensitive to adjacent magnetic structures such as shields; (c) there is no permanent magnetism to be altered or lost in the present invention; and (d) the ferromagnetic exchange interaction effect of the present invention is adjustable. These and other features and advantages will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
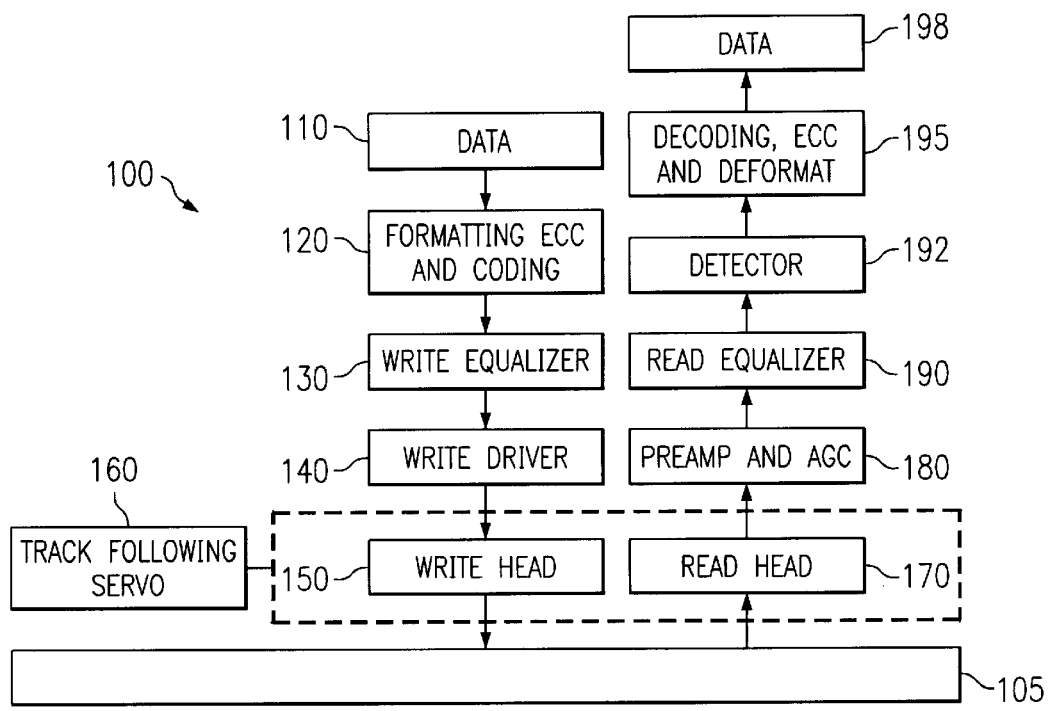
FIG. 1 depicts a block diagram of a data recording system in which the present invention may be implemented.

With reference now to the figures, and in particular with reference to FIG. 1, a block diagram of a data recording system in which the present invention may be implemented is illustrated. Data recording system 100 is an example of a tape or hard disk recording system that can record data from a host computer onto magnetic tape or disk. User data 110 enters the system to be written to magnetic media 105. The data is formatted and encoded 120, passed through a write equalizer circuit 130 (if necessary), and fed to the writing head 150 by means of a write driver 140 which supplies the electric current signals required for recording on the magnetic medium 105.

When reading the recorded data from the magnetic medium 105, the magnetic medium 105 is passed by a read head 170 in which the present invention may be implemented, as discussed hereafter. The read head 170 transforms the magnetic flux emanating from the magnetic medium into electric voltage signals by means of the magnetoresistive effect. These voltages are amplified 180 and amplitude equalized 190 before being passed into a detector 192 that interprets the signals as digital data. The data is un-encoded 195 and the user data 198 restored to the host computer.

Figure 2A:
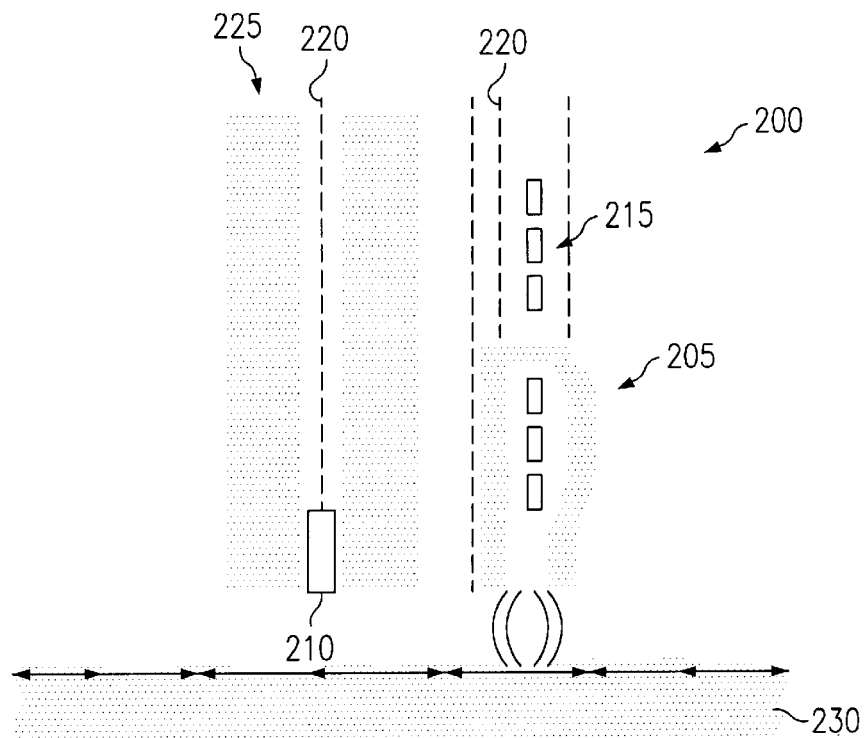
FIGS. 2A and 2B are exemplary block diagrams illustrating a spin valve sensor in a magnetic read/write head in accordance with embodiments of the present invention.
Figure 2B:
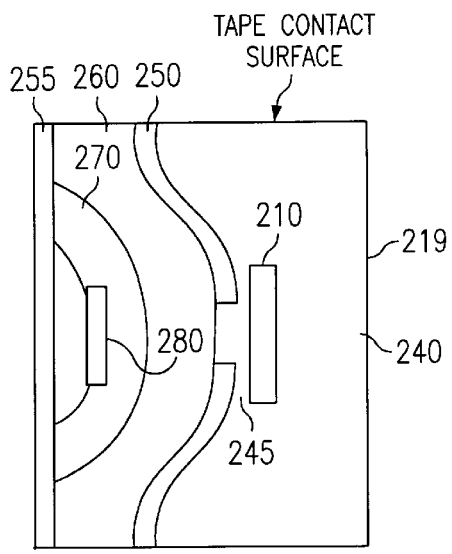

FIGS. 2A and 2B show cross sections of a magnetic head 200 having a magnetoresistive (MR) or giant magnetoresistive (GMR) sensor or spin valve sensor 210. The present invention will be described in terms of use with GMR spin valve sensor elements for illustrative purposes only. The present invention is equally applicable to normal magnetoresistive sensor elements as well and such an embodiment is intended to be within the spirit and scope of the present invention.

As shown in FIG. 2A, the magnetic head 200 includes an adjacent write head yoke 205, a spin valve sensor 210, coils 215, layered dielectrics 220, and magnetic shields 225. The magnetic head 200 is positioned above or in contact with a magnetic media 230, depending on the particular implementation. A gap between the magnetic head 200 and the magnetic media 230 is shown in FIG. 2A for clarity only. The coils 215 generate a magnetic field for writing data to the magnetic media 230. The coils 215 are wrapped around yoke 205 which focuses the magnetic field created by the coils 215. The spin valve sensor 210 is used for reading data from the magnetic media 230. The layered dielectrics 220 are used as an insulator for insulating the spin valve sensor 210 from the magnetic shields 225. The magnetic shields 225 shield the spin valve sensor from upstream and downstream bits during the read operation.

FIG. 2B shows a magnified view of a yoke style spin valve read head. The read head 219 includes a magnetoresistive spin valve element 210, i.e. spin valve sensor 210, positioned between two layers of an overcoat insulating material 240 and 245. The magnetoresistive spin valve element 210 is in close proximity to a top flux guide 250. The top flux guide 250 is separated from a bottom flux guide 255 by a gap insulator 260, planars 270, and bias conductor 280.

When the GMR spin valve element 210 is formed, a magnetic field is typically applied in a direction parallel to the plane of the spin valve element 210. Thus, the GMR spin valve element 210 exhibits a uniaxial anisotropy with an easy-axis of magnetization parallel to the direction of the applied field. As a magnetic media passes the spin valve read head, an external magnetic field is conducted by the top flux guide 250 and the bottom flux guide 255 to generate a magnetic field that is applied normal to the easy-axis of the GMR spin valve sensing layer element 210. The gap insulator 260, planars 270 and bias conductor 280 aid in conducting the magnetic flux from the magnetic media so that it is applied normal to the easy axis of the GMR spin valve sensing layer element 210.

Figure 3:
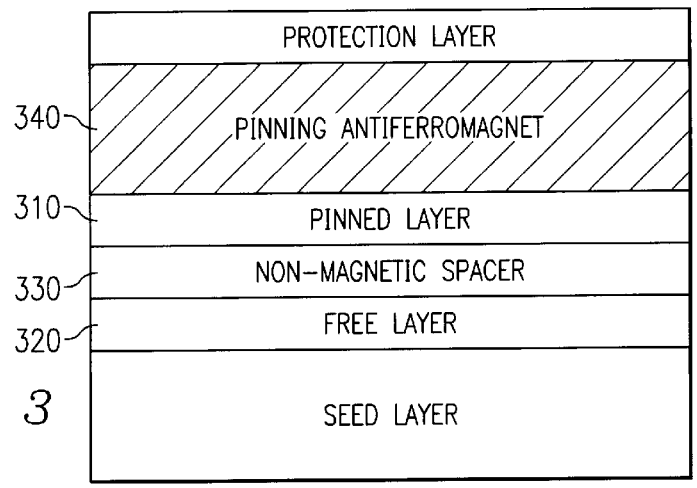
FIGS. 3 and 4 are exemplary diagrams of layer configurations that may comprise a spin valve sensor in accordance with the present invention.
Figure 4:
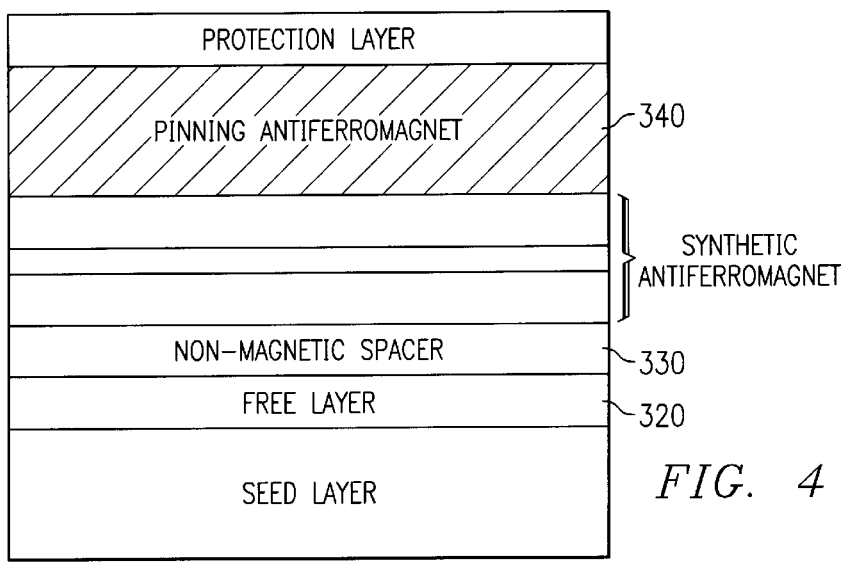

The spin valve sensor in these head structures is briefly described as follows. Referring to FIGS. 3 and 4, the spin valve is a layered structure based on two ferromagnetic layers 310 and 320 (for example, NiFe or CoFe) separated by a thin non-magnetic layer 330 (e.g., copper). One of the ferromagnetic layers 310 has its magnetization pinned, i.e. fixed, at 90 degrees with respect to the other ferromagnetic layer's 320 longitudinal oriented easy axis. This is called the pinned layer 310 and is held in place by the exchange field from an adjacent antiferromagnet 340 (such as NiO, PtMn or NiMn). The second ferromagnetic layer 320 has its magnetization free to rotate for sensing applied magnetic fields and is called the free or sensing layer.

Figure 5:
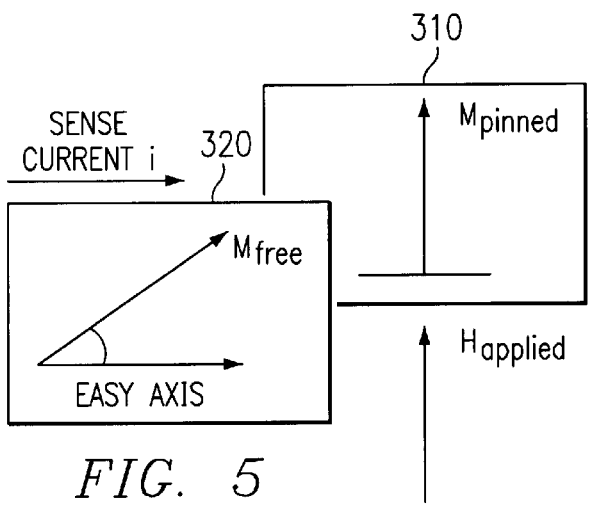
FIG. 5 is an exemplary diagram illustrating the manner by which the pinned and free layers of a spin valve sensor operate in the presence of an applied field.

FIGS. 3 and 4 are two embodiments of spin valves with different types of antiferromagnet/ferromagnet arrangements to achieve the same end. A diagram of the magnetic situation is shown in FIG. 5A. In response to an external magnetic field $H_{applied}$ being applied normal to the easy axis of the spin valve element free layer, the magnetization direction of the free layer rotates away from the easy axis direction toward the direction of the applied field. This magnetization rotation causes the electrical resistance of the spin valve element to change. Based on changes in the resistance of the GMR spin valve element and thus, the voltage output seen in the presence of a sense current i, the data recording on the magnetic tape can be read.

The present invention provides an apparatus and method of making stabilized MR/GMR spin valve elements using longitudinal ferromagnetic exchange interactions between closely spaced ferromagnets. The present invention makes use of ferromagnets to stabilize the GMR spin valve elements. In addition, the present invention makes use of a spacing layer whose thickness may be used to control the amount of ferromagnetic exchange in the MR/GMR spin valve elements. In this way, the stabilization of the MR/GMR spin valve elements may be "tuned" by adjusting the thickness of the spacing layer.

Figure 6:
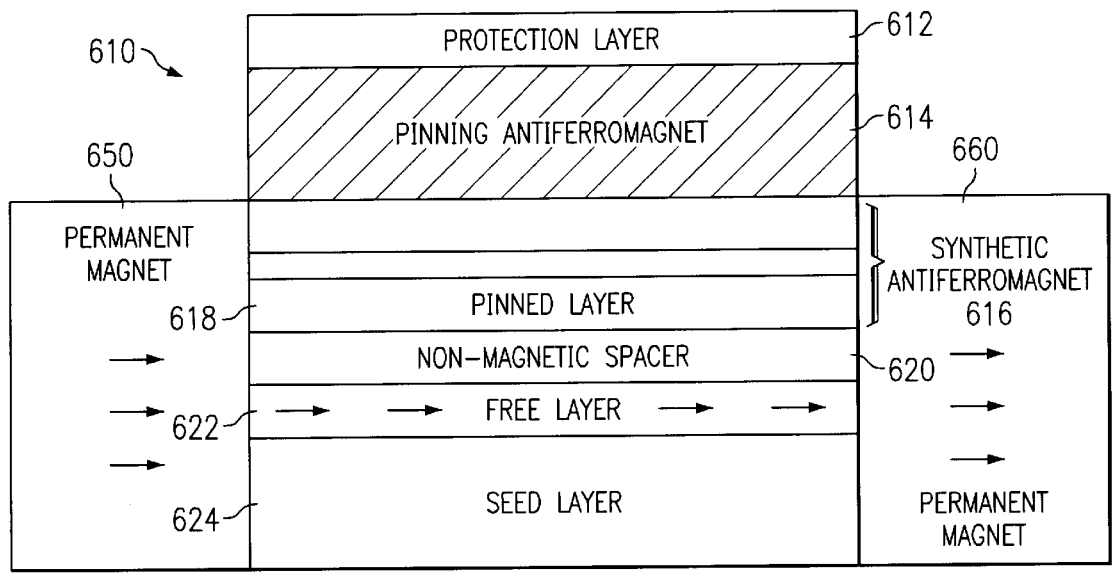
FIG. 6 is a diagram illustrating the use of end mounted permanent magnets to stabilize a MR/GMR spin valve sensor.

FIG. 6 is an exemplary block diagram illustrating a prior art mechanism in which permanent magnet stabilizing elements are used to increase the stability of the free layer of the spin valve sensor. As shown in FIG. 6, the spin valve sensor 610 includes a protection layer 612, a pinning antiferromagnet 614, a synthetic anti-ferromagnet 616, a pinned layer 618, a non-magnetic spacer 620, a free layer 622, and a seed layer 624. These layers are similar to those shown in FIG. 4 described above.

The synthetic anti-ferromagnet 616 is a substitute arrangement for the conventional pinned layer. The protection layer 612 covers the film stack with a more inert material to prevent the other materials on the stack from corroding or being attacked by subsequent device processing. The seed layer 624 ensures the correct grain or crystal structure in the films forming the sensor.

The structure shown in FIG. 6 further includes two permanent magnets 650 and 660 which are used to stabilize the free layer 622 of the spin valve sensor. The permanent magnets 650 and 660 apply a longitudinal easy axis field (depicted as arrows in FIG. 6) in the free layer 622 to thereby remove the domains in the sensor and suppress the onset of Barkhausen noise. This additional field effectively magnetically stabilizes the free layer 622. That is, enough magnetic effect is provided to clear out the domains in the sensor. This is different from stiffening the free layer 622 which alters the sensitivity by making the sensor respond less to a given input signal. A very stiff element may well be stable but a stable element does not have to be stiff.

By stabilizing the free layer 622 of the spin valve sensor 610, what is meant is that the free layer magnetization rotates smoothly without distortion or discontinuities when responding to changes in an applied magnetic field. Thus, perturbations in response to the applied magnetic field are essentially removed due to the stabilizing of the free layer 622.

Figure 7:
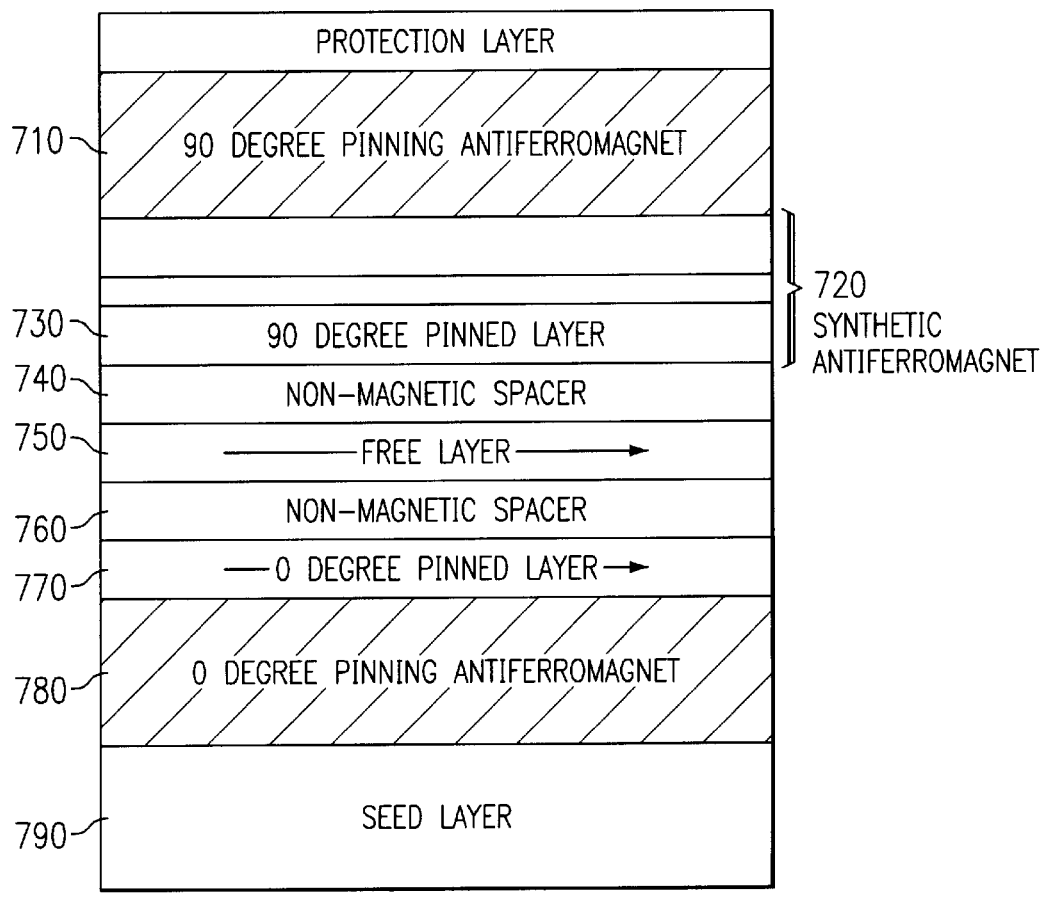
FIG. 7 is an exemplary diagram illustrating an apparatus of the present invention in which GMR spin valve read elements are stabilized using longitudinal ferromagnetic exchange interactions.

FIG. 7 is an exemplary diagram of a stabilized spin valve sensor according to the present invention. As shown in FIG. 7, the permanent magnets in the structure shown in FIG. 6 are removed and an additional ferromagnetic layer 770 is used which is pinned with its magnetization parallel to the easy axis of the free layer 750 by use of the 0 degree pinning antiferromagnet 780. The additional 0 degree pinning antiferromagnet 780 preferably has a different blocking temperature from the 90 degree pinning antiferromagnet so that the two antiferromagnets can sequentially be annealed with their appropriate orientations.

The additional ferromagnetic layer 770 is spaced away from the free layer by a thin non-magnetic layer 760 (such as copper, gold, an electron reflecting oxide layer, or the like) whose thickness can be used to control the amount of ferromagnetic exchange between the 0 degree pinned layer 770 and free layer 750. This ferromagnetic exchange effectively applies a longitudinal magnetic field to the free layer, which in turn eliminates the domains in the free layer. Thus, the present invention induces a magnetic field to the free layer to thereby stabilize the free layer with regard to perturbations in an output signal voltage in response to an applied magnetic field.

The amount of stabilization, or the amount of longitudinal exchange induced bias field, introduced into the free layer 750 may be controlled by changing the proximity of the 0 degree pinned layer 770. This proximity, in the present invention, is controlled by adjusting a thickness of the non-magnetic spacer 760. Thus, by adjusting the thickness of the non-magnetic spacer 760, the amount of longitudinal exchange induced bias field introduced into the free layer 750 may be adjusted and thereby control the amount of the stabilizing affect in the free layer 750. The thickness of this layer, in a preferred embodiment, is approximately between 10 and 25 Angstroms depending on the strength of the effect desired. Thus, the use of the configuration in FIG. 7 provides a "tuneable" spin valve sensor.

The use of an antiferromagnetic layer in a magnetoresistive element is generally taught in commonly assigned and copending U.S. patent application Ser. No. 09/170,330 now U.S. Pat. No. 6,278,594 entitled "Dual Element Magnetoresistive Read Head with Integral Element Stabilization," filed on Oct. 13, 1998, and which is hereby incorporated by reference. In this application, an antiferromagnetic layer is used in a normal magnetoresistive read head for stabilizing a magnetic domain of the magnetoresistive read head.

The present invention, however, uses ferromagnetic exchange interaction between two closely spaced ferromagnets. The prior application teaches the exchange bias effect of an antiferromagnet in contact with a ferromagnet.

Figure 8:
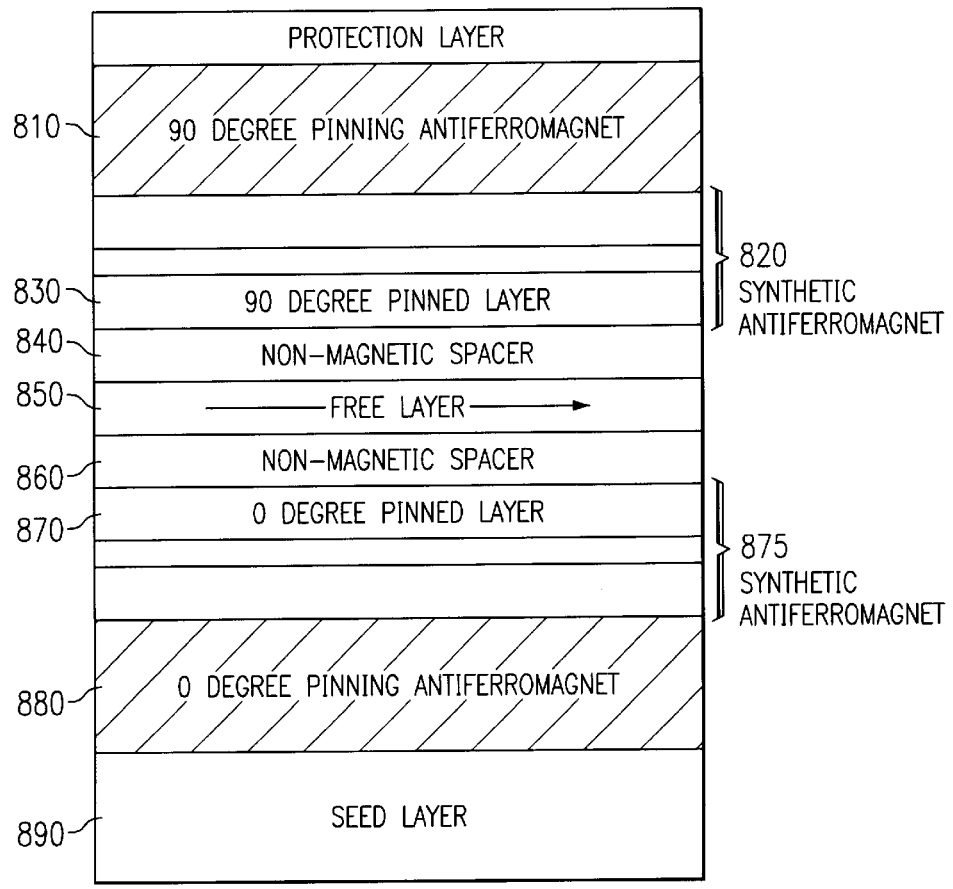
FIG. 8 is an exemplary diagram illustrating an alternative embodiment of the present invention.

FIG. 8 illustrates an alternative embodiment to the stabilized spin valve sensor apparatus of FIG. 7. The elements 810–860 and 880–890 correspond to similar elements 710–790 of FIG. 7. The difference between this embodiment and the embodiment shown in FIG. 7 is that a synthetic antiferromagnet 875 is provided in place of the 0 degree pinned ferromagnetic layer 770 of FIG. 7. The synthetic antiferromagnet 875 operates to provide the same effect as the 0 degree pinned ferromagnetic layer 770 with regard to the free layer. The benefit of the embodiment shown in FIG. 8, however, is that the magnetic moment from the 0 degree pinned layer (or more importantly the field generated by this magnetic moment) is effectively nulled by the presence of the second ferromagnetic layer forming the synthetic antiferromagnet.

Thus, with the present invention, a magnetic field is induced on the free layer to thereby stabilize the free layer with regard to perturbations in an output signal voltage in response to an applied magnetic field. The present invention provides an apparatus and method in which a free layer of a spin valve sensor may be stabilized without using permanent magnets. In this way, the drawbacks of permanent magnets set forth above in the Background of the Invention are eliminated. These drawbacks are eliminated because (a) the layers used do not rely on any retention of magnetization; (b) the effect of the effective applied field is not sensitive to adjacent magnetic structures such as shields; (c) there is no permanent magnetism to be altered or lost; and (d) the ferromagnetic exchange interaction effect is adjustable.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A spin valve sensor apparatus, comprising:
   a free layer; and
   a ferromagnetic layer in close proximity to the free layer, within a sensing area of the free layer, such that there is a ferromagnetic exchange between the free layer and the ferromagnetic layer, wherein the ferromagnetic layer induces a magnetic field to the free layer, by way of the ferromagnetic exchange between the ferromagnetic layer and the free layer, to thereby stabilize the free layer with regard to perturbations in an output signal voltage in response to an applied magnetic field.

2. The spin valve sensor apparatus of claim 1, wherein the ferromagnetic layer includes a pair of ferromagnetic layers which together comprise a synthetic antiferromagnetic layer.

3. The spin valve sensor apparatus of claim 1, further comprising an antiferromagnetic layer.

4. The spin valve sensor apparatus of claim 3, wherein the antiferromagnetic layer pins a second ferromagnetic layer at ninety degrees relative to an easy axis of the free layer.

5. The spin valve sensor apparatus of claim 3, wherein the antiferromagnetic layer pins the ferromagnetic layer at zero degrees relative to an easy axis of the free layer.

6. The spin valve sensor apparatus of claim 1, further comprising a pair of synthetic antiferromagnetic layers wherein the pair of synthetic antiferromagnetic layers includes a first synthetic antiferromagnetic layer pinned at zero degrees relative to an easy axis of the free layer, and a second synthetic antiferromagnetic layer pinned at ninety degrees relative to an easy axis of the free layer.

7. The spin valve sensor apparatus of claim 6, wherein the first and second antiferromagnetic layers have different blocking temperatures.

8. The spin valve sensor apparatus of claim 1, wherein the ferromagnetic layer is spaced from the free layer by a nonmagnetic layer.

9. The spin valve sensor apparatus of claim 8, wherein a thickness of the nonmagnetic layer is used to control an amount of ferromagnetic exchange between the ferromagnetic layer and the free layer.

10. The spin valve sensor apparatus of claim 1, wherein the spin valve sensor apparatus is part of a magnetic media read head.

11. The spin valve sensor apparatus of claim 10, wherein the magnetic media read head is one of a magnetic disk read head and a magnetic tape read head.

12. A spin valve sensor apparatus, comprising:
    a free layer; and
    a ferromagnetic layer, wherein the ferromagnetic layer induces a magnetic field to the free layer to thereby stabilize the free layer with regard to perturbations in an output signal voltage in response to an applied magnetic field, wherein the ferromagnetic layer is spaced from the free layer by a nonmagnetic layer, a thickness of the nonmagnetic layer is used to control an amount of ferromagnetic exchange between the ferromagnetic layer and the free layer, and wherein the thickness of the nonmagnetic layer is between 10 and 25 Angstroms.

13. A method of making a spin valve sensor apparatus, comprising:
    providing a free layer; and
    providing a ferromagnetic layer in close proximity to the free layer, within a sensing area of the free layer, such that there is a ferromagnetic exchange between the free layer and the ferromagnetic layer, wherein the ferromagnetic layer induces a magnetic field to the free layer, by way of the ferromagnetic exchange between the ferromagnetic layer and the free layer, to thereby stabilize the free layer with regard to perturbations in an output signal voltage in response to an applied magnetic field.

14. The method of claim 13, wherein the ferromagnetic layer includes a pair of ferromagnetic layers which together comprise a synthetic antiferromagnetic layer.

15. The method of claim 13, further comprising providing an antiferromagnetic layer.

16. The method of claim 15, wherein the antiferromagnetic layer pins a second ferromagnetic layer at ninety degrees relative to an easy axis of the free layer.

17. The method of claim 15, wherein the antiferromagnetic layer pins the ferromagnetic layer at zero degrees relative to an easy axis of the free layer.

18. The method of claim 13, further comprising providing a pair of synthetic antiferromagnetic layers, wherein the pair of synthetic antiferromagnetic layers includes a first synthetic antiferromagnetic layer pinned at zero degrees relative to an easy axis of the free layer, and a second synthetic antiferromagnetic layer pinned at ninety degrees relative to an easy axis of the free layer.

19. The method of claim 18, wherein the first and second antiferromagnetic layers have different blocking temperatures.

20. The method of claim 13, wherein the ferromagnetic layer is spaced from the free layer by a nonmagnetic layer.

21. The method of claim 20, wherein a thickness of the nonmagnetic layer is used to control an amount of ferromagnetic exchange between the ferromagnetic layer and the free layer.

22. The method of claim 13, wherein the spin valve sensor apparatus is part of a magnetic media read head.

23. The method of claim 22, wherein the magnetic media read head is one of a magnetic disk read head and a magnetic tape read head.

24. A method of making a spin valve sensor apparatus, comprising:

providing a free layer; and providing a ferromagnetic layer, wherein the ferromagnetic layer induces a magnetic field to the free layer to thereby stabilize the free layer with regard to perturbations in an output signal voltage in response to an applied magnetic field, wherein the ferromagnetic layer is spaced from the free layer by a nonmagnetic layer, a thickness of the nonmagnetic layer is used to control an amount of ferromagnetic exchange between the ferromagnetic layer and the free layer, and wherein the thickness of the nonmagnetic layer is between 10 and 25 Angstroms.

* * * * *